(12) United States Patent
Janssen et al.

(10) Patent No.: US 9,665,538 B2
(45) Date of Patent: May 30, 2017

(54) SOLVING SATISFIABILITY PROBLEMS THROUGH SEARCH

(71) Applicant: International Business Machines Corporation, Armonk, NY (US)

(72) Inventors: Gradus Janssen, Putnam Valley, NY (US); Jinjun Xiong, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 227 days.

(21) Appl. No.: 14/145,300

(22) Filed: Dec. 31, 2013

(65) Prior Publication Data

US 2015/0186505 A1    Jul. 2, 2015

(51) Int. Cl.
    *G06F 17/30*     (2006.01)
    *G06F 17/11*     (2006.01)
    *G06F 17/50*     (2006.01)

(52) U.S. Cl.
    CPC .......... *G06F 17/11* (2013.01); *G06F 17/5027* (2013.01)

(58) Field of Classification Search
    CPC .. G06F 17/11; G06F 17/5045; G06F 17/3024; G06F 17/5027
    See application file for complete search history.

(56) References Cited

U.S. PATENT DOCUMENTS 5,404,518 A * 4/1995 Gilbertson ........ G06F 17/30702
7,047,139 B2 * 5/2006 Shtrichman ........... G06F 17/504
                                                                                                                                                                                   702/22

7,577,625 B2 * 8/2009 Zhang ...................... G06N 7/00
                                                                                                                                                                                   706/19
2003/0220926 A1 * 11/2003 Huelsman ................ G06N 5/02
2004/0068497 A1 * 4/2004 Rishel ............... G06F 17/30672
(Continued)

FOREIGN PATENT DOCUMENTS

CN        1525550 A      9/2004
EP        1 681 633 A3      7/2006

OTHER PUBLICATIONS

Zhang et al., "Conflict Driven Learning in a Quantified Boolean Satisfiability Solver", 2002, Princeton University.*
(Continued)

*Primary Examiner* — Apu Mofiz
*Assistant Examiner* — Sheryl Holland

(57) ABSTRACT

One embodiment of a method for solving an input satisfiability instance includes searching a database for a stored satisfiability instance that matches the input satisfiability instance and outputting a solution to the input satisfiability instance. One embodiment of method for converting an input satisfiability instance into a standardized representation includes applying a plurality of syntactical simplification rules to the input satisfiability instance until no conditions of any of the plurality of syntactical simplification rules can be met, thereby producing a simplified instance, uniformly replacing each variable in the simplified instance with a unique, consecutively chosen even number, annotating each literal in the simplified instance to indicate whether the each literal is positive or negative, ordering all literals in the simplified instance, and ordering all clauses in the simplified instance to produce the standardized representation.

11 Claims, 6 Drawing Sheets

(56) References Cited

U.S. PATENT DOCUMENTS

| | | | | |
|---|---|---|---|---|
| 2006/0190865 A1* | 8/2006 | Yu | ............................ | G06F 17/504 716/106 |
| 2007/0174799 A1* | 7/2007 | Baumgartner | ........ | G06F 17/504 716/103 |
| 2008/0086705 A1* | 4/2008 | Balasubramanian | ... | G06F 8/427 716/103 |
| 2008/0288904 A1* | 11/2008 | Rahim | ................ | G06F 17/5031 716/113 |
| 2009/0024557 A1* | 1/2009 | Fuhrmann | ............. | G06F 17/504 706/58 |
| 2009/0225986 A1* | 9/2009 | Gennaro | ............... | H04L 9/0836 380/278 |
| 2009/0254512 A1* | 10/2009 | Broder | ................... | G06Q 30/02 |
| 2009/0281999 A1* | 11/2009 | Sinha | ....................... | G06F 8/433 |
| 2012/0030650 A1* | 2/2012 | Ravindran | ................ | G06F 8/34 717/107 |
| 2012/0317647 A1* | 12/2012 | Brumley | ................. | G06F 21/00 726/25 |
| 2014/0040855 A1* | 2/2014 | Wang | ................... | G06F 9/4436 717/107 |

OTHER PUBLICATIONS

Gomes et al., "Satisfiability Solvers", 2008, Elesivier, Handbook of Knowledge Representation.*

Lee et al, "Fundamental Algorithms for System Modeling, Analysis and Optimization", 2011, UC Berkeley.*

Marques-Silva et al., "Boolean Satisfiability in Electronic Design Automation", 2009, ACM.*

English Translation of Chinese Patent Application Serial No. CN 1525550 A, published Sep. 1, 2004, consists of 6 unnumbered pages.

* cited by examiner

SOLVING SATISFIABILITY PROBLEMS THROUGH SEARCH

FIELD OF THE DISCLOSURE

The present disclosure relates generally to computer science and relates more specifically to solving satisfiability problems.

BACKGROUND OF THE DISCLOSURE

Many computer science applications involve solving for satisfiability. Satisfiability is the problem of determining: (1) if the variables of a given Boolean formula can be assigned so that the formula evaluates to TRUE; and (2) the values of those variables that result in the TRUE evaluation. A problem for which no set of variable assignments can be found that results in a TRUE evaluation is said to be unsatisfiable. For instance, various stages of electronic design automation (e.g., formal verification, automatic test pattern generation, etc.) may involve solving for the satisfiability of a formula. Many other types of decision and optimization problems can also be transformed into satisfiability problems.

Currently, there are no known algorithms that can efficiently solve all instances of satisfiability. However, many practical satisfiability instances can be solved quickly, even when the instances have thousands of variables and tens of thousands of clauses. At the same time, some smaller satisfiability instances can exhibit exponential run times, and there is no reliable way of determining, before a solution is attempted, whether an instance will or will not be quickly solvable. In addition to variability among the instances, efficiently solving for satisfiability can also be impacted by the particular solver used. For instance, different solvers will find different instances to be easy or hard (e.g., some solvers may excel at proving unsatisfiability, while other solvers will excel at finding solutions). Moreover, most satisfiability solvers include time-outs, meaning that if an instance is not solved within a threshold period of time, the solver abandons the attempt. This does not necessarily mean that the instance is unsatisfiable; it only means that a solution could not found within the limited time that the solver had to find one.

In practice, many of the same satisfiability instances may be solved over and over again, thereby wasting processing resources since it may take a great deal of time for a processor to solve even a single instance.

SUMMARY OF THE DISCLOSURE

One embodiment of a method for solving an input satisfiability instance includes searching a database for a stored satisfiability instance that matches the input satisfiability instance and outputting a solution to the input satisfiability instance.

In another embodiment, a tangible computer readable storage medium stores instructions which, when executed by a processor, cause the processor to perform operations for solving an input satisfiability instance, the operations including searching a database for a stored satisfiability instance that matches the input satisfiability instance and outputting a solution to the input satisfiability instance.

In another embodiment, a system for solving an input satisfiability instance includes a database storing a plurality of entries, each of the plurality of entries including a stored satisfiability instance and a stored solution to the stored satisfiability instance, and a search engine for identifying one of the plurality of entries that corresponds to the input satisfiability instance.

One embodiment of method for converting an input satisfiability instance into a standardized representation includes applying a plurality of syntactical simplification rules to the input satisfiability instance until no conditions of any of the plurality of syntactical simplification rules can be met, thereby producing a simplified instance, uniformly replacing each variable in the simplified instance with a unique, consecutively chosen even number, annotating each literal in the simplified instance to indicate whether the each literal is positive or negative, ordering all literals in the simplified instance, and ordering all clauses in the simplified instance to produce the standardized representation.

One embodiment of a method for storing a known satisfiability instance in a manner that facilitates searching includes providing a root node and a plurality of leaf nodes connected to the root node and identifying each of the plurality of leaf nodes with an identifier that corresponds to a clause of the stored satisfiability instance, such that the stored satisfiability instance can be represented as a vector of ordered identifiers from the plurality of leaf nodes.

BRIEF DESCRIPTION OF THE DRAWINGS

The teachings of the present disclosure can be readily understood by considering the following detailed description in conjunction with the accompanying drawings, in which.

To facilitate understanding, identical reference numerals have been used, where possible, to designate identical elements that are common to the Figures.

DETAILED DESCRIPTION

In one embodiment, the present invention is a method and apparatus for solving satisfiability problems through search. A satisfiability problem is a problem in propositional logic that asks for a truth-assignment to a set of variables that will satisfy (i.e., make true) a conjunction of disjunctive clauses over these variables. In other words, the truth-assignment to the variables makes all clauses true. If such a truth-assignment can be found, the problem is said to be satisfiable; if no such truth-assignment is found, the problem is unsatisfiable (or is a "contradiction"). Embodiments of the invention provide a searchable repository of solutions to satisfiability instances. When a solver receives a satisfiability instance for which a solution is desired, it may search the repository for a stored solution as an alternative to or in addition to attempting to solve the instance. Because modern memory is relatively cheap (e.g., compared to processors)

and search engines can be very powerful (e.g., parallelism is easily achieved), this is an efficient approach to solving satisfiability problems.

Figure 1:
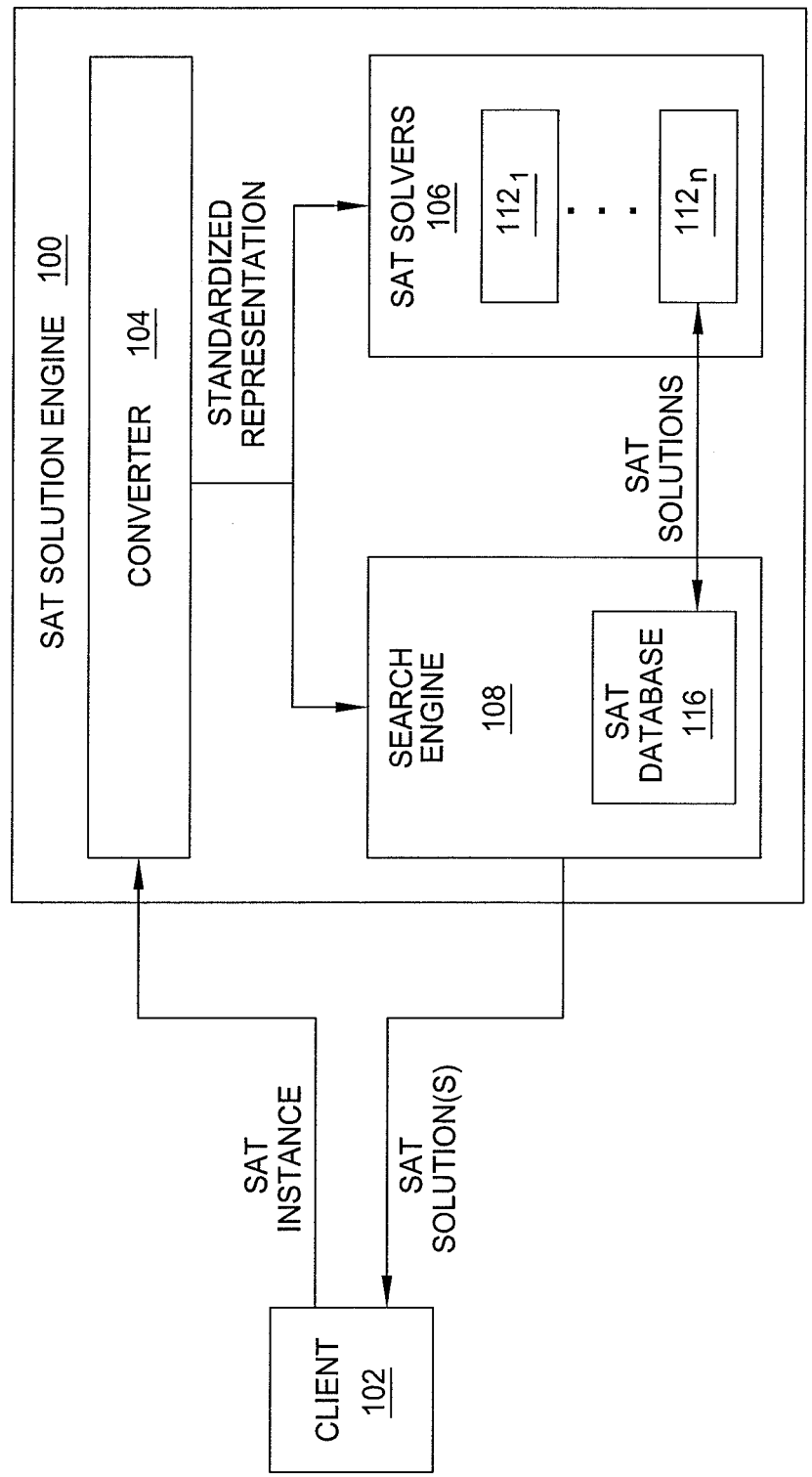
FIG. 1 is a high level block diagram illustrating one embodiment of a satisfiability solution engine for solving satisfiability problems.

FIG. 1 is a high level block diagram illustrating one embodiment of a satisfiability solution engine 100 for solving satisfiability problems. The satisfiability (SAT) solution engine 100 receives as an input a satisfiability instance for which a solution is desired (e.g., a Boolean formula containing variables for which assignments are desired to make the formula evaluate to TRUE). The input satisfiability instance may be received from a client device 102. The satisfiability solution engine 100 produces as an output a solution to the input satisfiability instance (e.g., an indication as to whether the instance is satisfiable and/or possible variable assignments that will result in the TRUE evaluation, or a time-out). The solution may be returned to the client device 102 from which the input satisfiability instance was received.

As illustrated, the satisfiability solution engine 100 generally comprises a converter 104, a bank 106 of satisfiability solvers $112_1$-$112_n$ (hereinafter collectively referred to as "solvers 112"), and a search engine 108 that includes a satisfiability database 110. All of these components may reside in a centralized physical location, or they may be distributed over two or more locations.

The converter 104 comprises a processor that converts the input satisfiability instance into a standardized representation that can be submitted to the solvers 112 and search engine 108. In one embodiment, the standardized representation is a canonical syntactical description of the input satisfiability instance. One embodiment of a method for converting an input satisfiability instance into a canonical syntactical representation is discussed in further detail below.

The bank 106 of satisfiability solvers 112 comprises a plurality of different satisfiability solvers 112. Each of the solvers 112 includes a processor that, according to its programming, may find different instances to be easy or hard (e.g., some of the solvers 112 may excel at proving unsatisfiability, while others of the solvers 112 may excel at finding solutions). In one embodiment, the solvers 112 may include any one or more commercially available satisfiability solvers.

The search engine 108 comprises a processor designed to search the satisfiability database 110 for stored satisfiability solutions matching the input satisfiability instance. The satisfiability database 110 comprises a searchable repository of stored solutions to satisfiability instances. In one embodiment, the solutions are indexed according to the satisfiability instances to which they correspond, which are stored in a standardized representation (e.g., a canonical syntactical representation) in order to facilitate searching.

The satisfiability database 110 may be centralized, distributed, or a combination of the two (e.g., comprising in-core random access memory (RAM) and/or offline disk). Utilization of storage space in the satisfiability database 110 may be optimized by detecting a partial order among satisfiability instances and sharing space among sub-instances. In addition, the solutions stored in the satisfiability database 110 may be supplemented with new solutions (e.g., new solutions to existing satisfiability problems and/or solutions to new satisfiability instances). In one embodiment, variable assignments stored in the satisfiability database 110 are encoded to save storage space. Some of these new solutions may come from one or more of the satisfiability solvers 112.

In one embodiment, the satisfiability database 110 is constructed offline (e.g., before the satisfiability solution engine 100 is run), online (e.g., after the satisfiability solution engine 100 is run), or incrementally. The satisfiability database 110 may also be supplemented in one embodiment through crowd sourcing.

Entries in the satisfiability database 110 may be organized differently for different applications, in order to speed up searching. The entries may also be organized to aid in parallel search, including distributed search (e.g., such as searches executed according to the Apache HADOOP open source framework). Search speed may also be increased by caching for faster access to more frequently used entries.

As discussed in further detail below, the satisfiability solvers 112 and the search engine 108 may operate serially or in parallel, and a solution to the input satisfiability instance may be produced by one or both of these components. Any solutions produced are returned to the client 102 from which the input satisfiability instance was received and are also optionally stored in the satisfiability database 110.

The satisfiability solution engine 100 is therefore capable of providing solutions to satisfiability instances in a more efficient and less costly manner than conventional satisfiability solvers. Although the satisfiability solution engine 100 may rely in part on solvers 112, it also makes use of the searchable database 110 of solutions to satisfiability instances. Because modern memory is relatively cheap and search engines can be very powerful, this is an efficient approach to solving satisfiability problems.

The satisfiability solution engine 100 can be implemented as a stand-alone solution (e.g., in which a customer owns the satisfiability database 100 and provides their own satisfiability solvers 112 in order to build the satisfiability database 100). Alternatively, the satisfiability solution engine 100 can be implemented as a service (e.g., in which a customer provides a query from a remote device, but does not own the satisfiability database 100 or satisfiability solvers 112).

Figure 2:
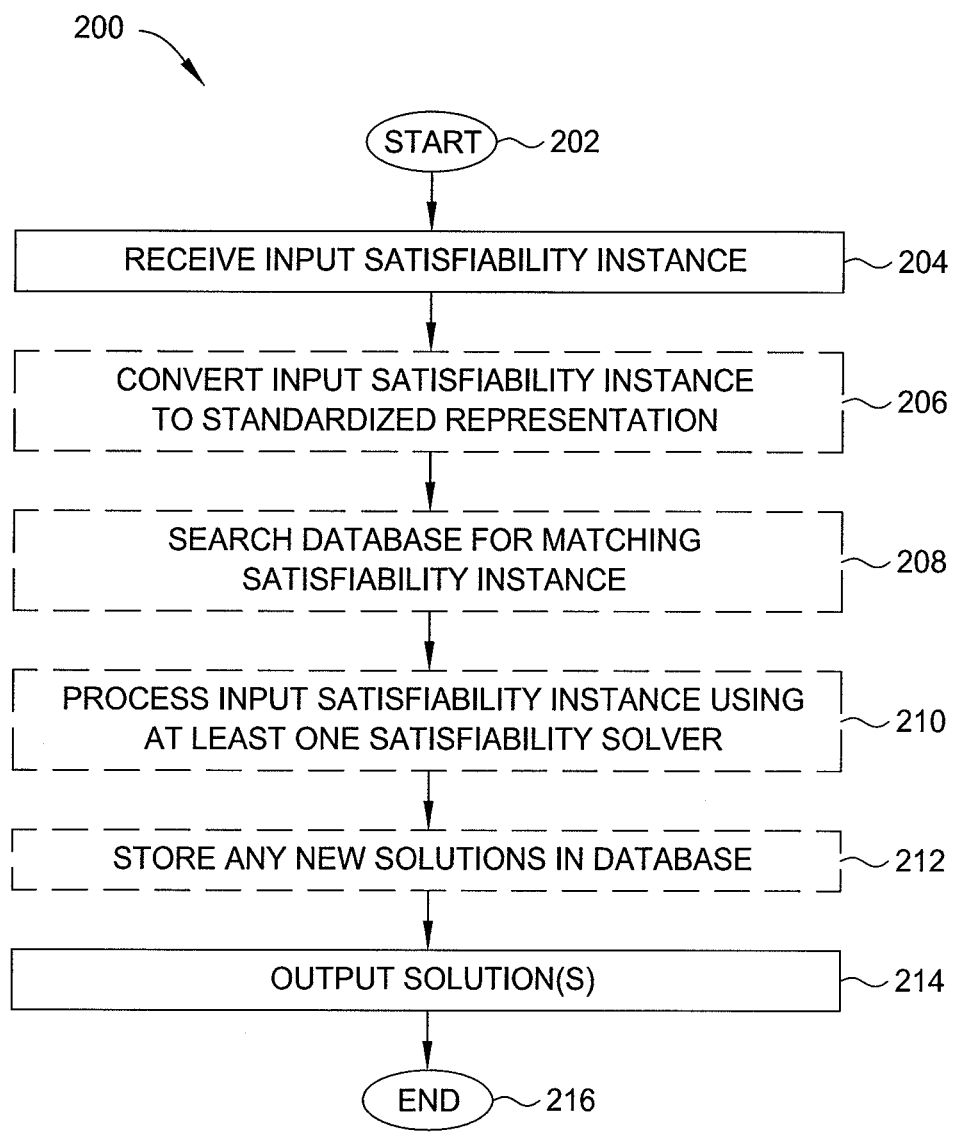
FIG. 2 is a flow diagram illustrating one embodiment of a method for solving a satisfiability instance.

FIG. 2 is a flow diagram illustrating one embodiment of a method 200 for solving a satisfiability instance. The method 200 may be implemented, for example, in conjunction with the satisfiability solution engine 100 illustrated in FIG. 1. As such, the discussion of the method 200 makes reference to various items illustrated in FIG. 1. However, it will be appreciated that the method 200 is not limited to execution on the satisfiability solution engine 100, and may be implemented in conjunction with systems having alternative configurations.

The method 200 begins in step 202. In step 204, the satisfiability solution engine 100 receives an input satisfiability instance (e.g., via an input device such as a keyboard, a mouse, a touch screen, or the like). The input satisfiability instance comprises a problem for which a solution is desired (e.g., a Boolean formula containing variables for which assignments are desired to make the formula evaluate to TRUE).

In optional step 206 (illustrated in phantom), the converter 104 converts the input satisfiability instance into a standardized representation. This step is optional, because in some cases conversion may not be necessary depending on the indexing scheme of the satisfiability database 110 and/or the format in which the input satisfiability instance is received. In one embodiment, the standardized representation is a canonical syntactical description of the input satisfiability instance.

In optional step 208 (illustrated in phantom), the search engine 108 searches the satisfiability database 110 for a stored solution to the input satisfiability instance. This step in optional, because in some cases it is possible that a solution can be produced relying solely on the satisfiability solvers 112. Also, in certain cases, it may be more efficient to skip the search. For instance, an optional pre-processing step may indicate that the input satisfiability instance is actually very easy to solve and not likely to consume significant processing resources.

In optional step 210 (illustrated in phantom), one or more of the satisfiability solvers 112 process the input satisfiability instance in an attempt to produce a solution. This step is optional, because it is possible that a solution can be produced relying solely on the search engine. However, although steps 208 and 210 are both indicated as being optional, it is noted that at least one of these steps should be performed; it is simply not necessary that they both be performed. Moreover, step 210 does not necessarily need to be performed after step 208. Alternatively, step 210 could be performed before step 208, or steps 208 and 210 could be performed in parallel until at least one solution is produced.

In optional step 212 (illustrated in phantom), the satisfiability database 110 stores at least one new solution to the input satisfiability instance. For instance, if the satisfiability solvers 112 were engaged in step 210, and at least one of the satisfiability solvers 112 produced a new solution (e.g., either a new solution to a stored satisfiability instance that corresponds to the input satisfiability instance, or a solution to the input satisfiability instance where the input satisfiability instance does not correspond to any stored satisfiability instance), the new solution may be stored in order to improve future results produced by the satisfiability solution engine 100.

In step 214, the satisfiability solution engine 100 outputs the solution(s) to the input satisfiability instance. The solution may simply indicate whether the instance is satisfiable or unsatisfiable, or it may (instead or additionally) indicate variable assignments that will result in the input satisfiability instance evaluating to TRUE. In another embodiment, the solution may indicate that a time-out occurred before any solution could be found. In a further embodiment still, the satisfiability solution engine 100 may output multiple solutions to the input satisfiability instance. For example, several different assignments of variables may be possible that will all result in the input satisfiability instance evaluating to TRUE.

In a further embodiment, different solutions are associated with one or more application-specific characteristics (e.g., area, power, or the like). This is because different solutions may result in different application-specific advantages. For example, one solution may be more power-efficient than another solution, even though both solutions are valid. In one embodiment, different solutions to the same satisfiability instance are related to each other in the satisfiability database 110.

The method 200 ends in step 216.

As discussed above, embodiments of the present invention involve conversion of an input satisfiability instance to a standardized representation. This standardized representation facilitates the identification of structurally (i.e., syntactically) equivalent instances. More specifically, the standardized representation ensures that instances that differ only in the naming of the variables (i.e., symbols that may be assigned Boolean values), the order of the literals (i.e., Boolean variables in either their positive or negative forms; if all occurrences of a Boolean variable in an instance are of the same polarity, then the variable is referred to as a "pure literal"), and the order of the clauses (i.e., sets of literals) can all be unambiguously transformed into a form that establishes that the instances are structurally equivalent.

Figure 3:
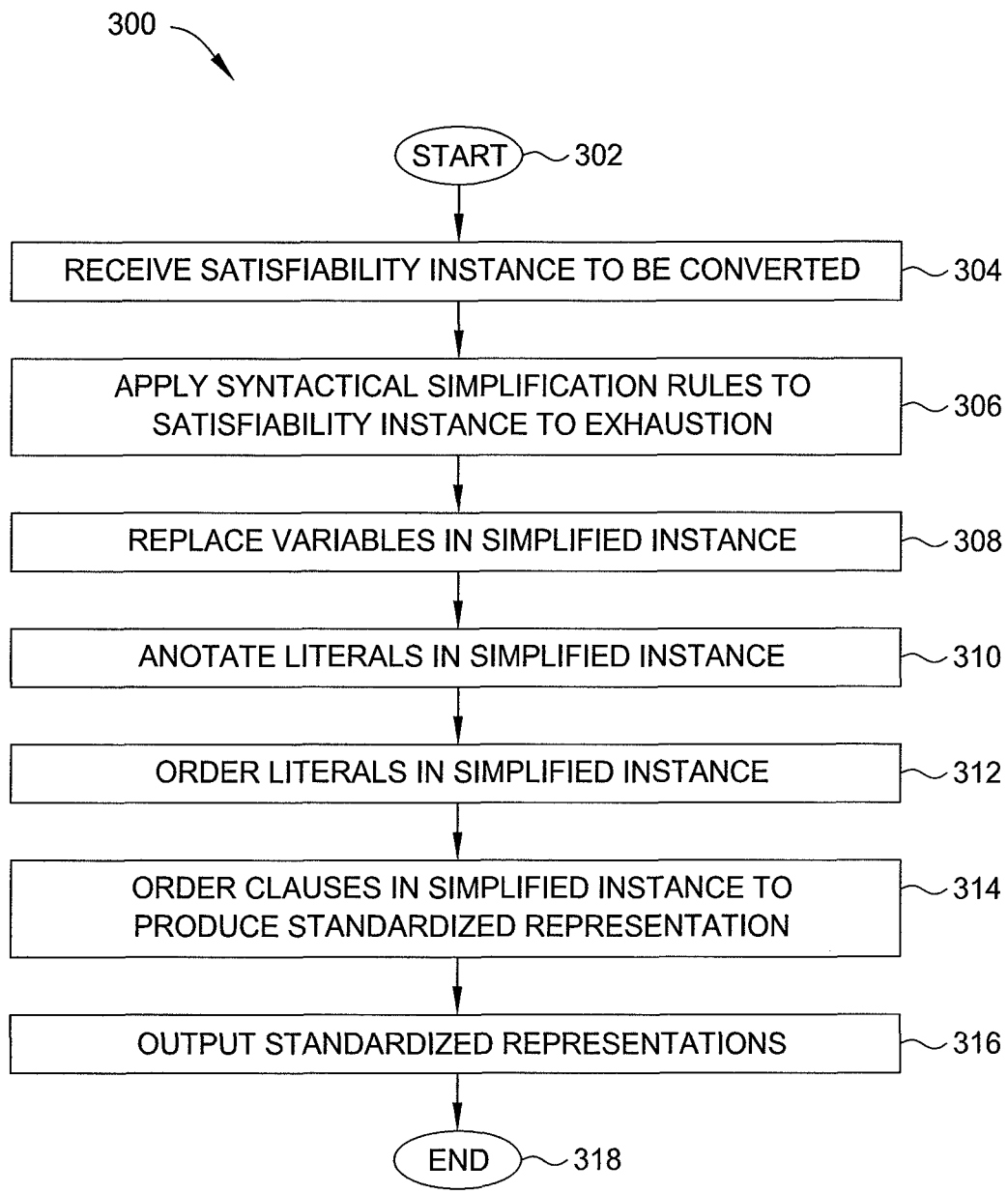
FIG. 3 is a flow diagram illustrating one embodiment of a method for converting a satisfiability instance into a canonical form.

In one embodiment, the standardized representation is a canonical representation. FIG. 3 is a flow diagram illustrating one embodiment of a method 300 for converting a satisfiability instance into a canonical form. The method 300 may be implemented, for example, in conjunction with the converter 104 illustrated in FIG. 1. As such, the discussion of the method 300 makes reference to the converter 104. However, it will be appreciated that the method 300 is not limited to execution on the satisfiability solution engine 100, and may be implemented in conjunction with systems having alternative configurations.

The method 300 begins in step 302. In step 304, the converter receives a satisfiability instance to be converted. As an illustrative example, consider the following two instances: {(−q −p −r)(q p)(q −p r)(p r)} and {(−a −b −c)(−a b c)(a −b c) (a b −c)(a b c)}.

In step 306, the converter 104 applies syntactical simplification rules until the rules have been exhausted, to produce a simplified instance. Syntactical simplification rules transformation (rewrite) a satisfiability instance in a manner that preserves satisfiability. That is, each rule results in either a semantically equivalent instance or a new instance that is implied by the original instance. Thus, if the original instance was satisfiable, none of the rules will result in an unsatisfiable instance. Although a solution to the resultant instance may turn out to be only a partial solution to the original instance, it will not preclude a complete solution.

In one embodiment, the syntactical simplification rules include: empty instance (i.e., if the instance contains no clauses, then the instance's meaning is TRUE), presence of empty clause (i.e., if the instance contains a clause containing no literals, then the instance's meaning is FALSE, and all other empty or non-empty clauses may be dropped), pure literal elimination (i.e., if the instance contains a pure literal, then all clauses containing the literal are dropped, and a meaning of TRUE is assigned to the pure literal), unit propagation (i.e., if the instance contains a clause containing a single literal, then that clause and all other clauses containing that literal are dropped; all occurrences of the opposite literal are also dropped from the remaining clauses, and a meaning of TRUE is assigned to the literal); trivial clause (i.e., if the instance contains a clause containing both the positive and negative literal of the same variable, then that clause is dropped); subsumption (i.e., if the instance contains two clauses such that the first clause is a subset of the second clause, then the second clause is dropped since the truth of the first clause implies the truth of the second clause), restriction solution (i.e., if the instance contains two clauses that contain opposite literals, and there are no other occurrences of those literals in the clause, then the two clauses are replaced by their union in which the opposite literals are dropped), and self-subsuming resolution (i.e., if the instance contains two clauses that contain opposite literals, and if the first clause is a subset or equal to the second clause, then the resolution literal is dropped from the second clause).

Applying the syntactical simplification rules to exhaustion (i.e., in accordance with step 306 of the method 300) means that the rules are applied to the instance until none of the conditions of the rules can be met. In one embodiment, the rules are applied in a predetermined order and repeated as long as a change to the instance is in effect. The time complexity of this step is polynomially bounded (i.e., every rule application diminishes the size of the instance by at least one literal). About the resultant simplified instance, one may assume that: (1) it contains at least one non-empty clause; (2) each clause in the instance contains at least two literals;

(3) it contains no clauses containing both the positive and negative literal of the same variable; and (4) it contains no clauses that are subsets of other clauses in the instance. Referring back to the illustrative example above, the exemplary instances would, through application of these rules to exhaustion, result in the simplified instances: {(−q −p −r)(q p)(q r)(p r)} and {(−a −b −c)(b c)(a c)(a b)}.

In step 308, the converter 104 uniformly replaces each variable in the simplified instance by a unique, consecutively chosen even number. In one embodiment, this starts by replacing the first variable with zero. The choice of which number is assigned to which variable is significant. A simple approach includes counting the positive and negative literal occurrences of each variable, and using the pair of numbers to lexicographically order the variables (ties may be broken arbitrarily). Referring back to the illustrative example above, the variable exemplary replacements for the simplified instances could be arbitrarily chosen as: p=0, q=2, r=4, and a=2, b=0, c=4.

In step 310, the converter 104 annotates the literals in the simplified instance. In one embodiment, a positive literal is represented by the variable itself (i.e., an even number based on the above exemplary variable replacing scheme); a negative literal is represented by adding one to the variable (i.e., so that the negative literals are odd numbers starting with one based on the above exemplary variable replacing scheme). A clause will never contain an even literal x and its odd successor x+1, since that would render the clause trivial (i.e., containing both the positive and negative literal of the same variable, which would cause the clause to be dropped when the syntactical simplification rules are applied). An odd literal y and its even successor y+1 refer to two different variables, and, hence, both can occur in the same clause. Referring back to the illustrative example above, the exemplary simplified instances would, through literal notation, result in: {(3 1 5)(2 0)(2 4)(0 4)} and {(3 1 5)(0 4)(2 4)(2 0)}.

In step 312, the converter 104 orders the literals in the simplified instance. In one embodiment, literals are ordered by increasing value (a clause is a set, so there will be no duplicates). Referring back to the illustrative example above, the exemplary simplified instances would, through ordering of the literals, result in: {(1 3 5)(0 2)(2 4)(0 4)} and {(1 3 5)(0 4)(2 4)(0 2)}.

In step 314, the converter 104 orders the clauses in the simplified instance. In one embodiment, the clauses are ordered lexicographically, according to the literal sequences. In a further embodiment, this step assumes padding with least-valued blanks when comparing a smaller literal sequence against a larger literal sequence. Referring back to the illustrative example above, the exemplary simplified instances would, through ordering of the clauses, result in: {(0 2)(0 4)(2 4)(1 3 5)} and {(0 2)(0 4)(2 4)(1 3 5)}. The resultant instances are now expressed in a standardized (canonical) representation. The fact that identical instances are obtained from the illustrative examples should be considered accidental; there is no guarantee that this will be the result for any two semantically equivalent instances that are subjected to processing under the method 300.

In step 316, the converter 104 outputs the standardized representations (e.g., to the search engine 108 and/or the satisfiability solvers 112).

The method 300 ends in step 318.

Standardized representations that are produced according to the method 300 can be considered as sequences (or vectors) of increasing numbers. Because they are free from subsumption, no sequence can be the prefix (or suffix) of another sequence within the same instance. On the other hand, different instances could share (parts of) clauses. This fact can be exploited for storage purposes. For instance, the shared parts can be stored only once in the satisfiability database 110, as suggested above.

A so-called trie can be used to maximally share clause prefixes. A trie is a tree-like structure with a root node and leaf nodes with some special properties. Thus, it is efficient to establish presence of a clause in a trie by traversing a path from the root node to a leaf.

In one embodiment, the leaf nodes of the trie are identified with the clauses. This way, a clause itself can be assigned a unique number. An instance (i.e., set of clauses) can then be represented as a vector of ordered trie identifiers. Different instances that share prefixes of the clause identifiers can be stored in a separate, second trie. The savings in storage are thus twofold: (1) common parts (prefixes, in this case) of clauses are shared; and (2) parts of instances are shared.

Figure 4:
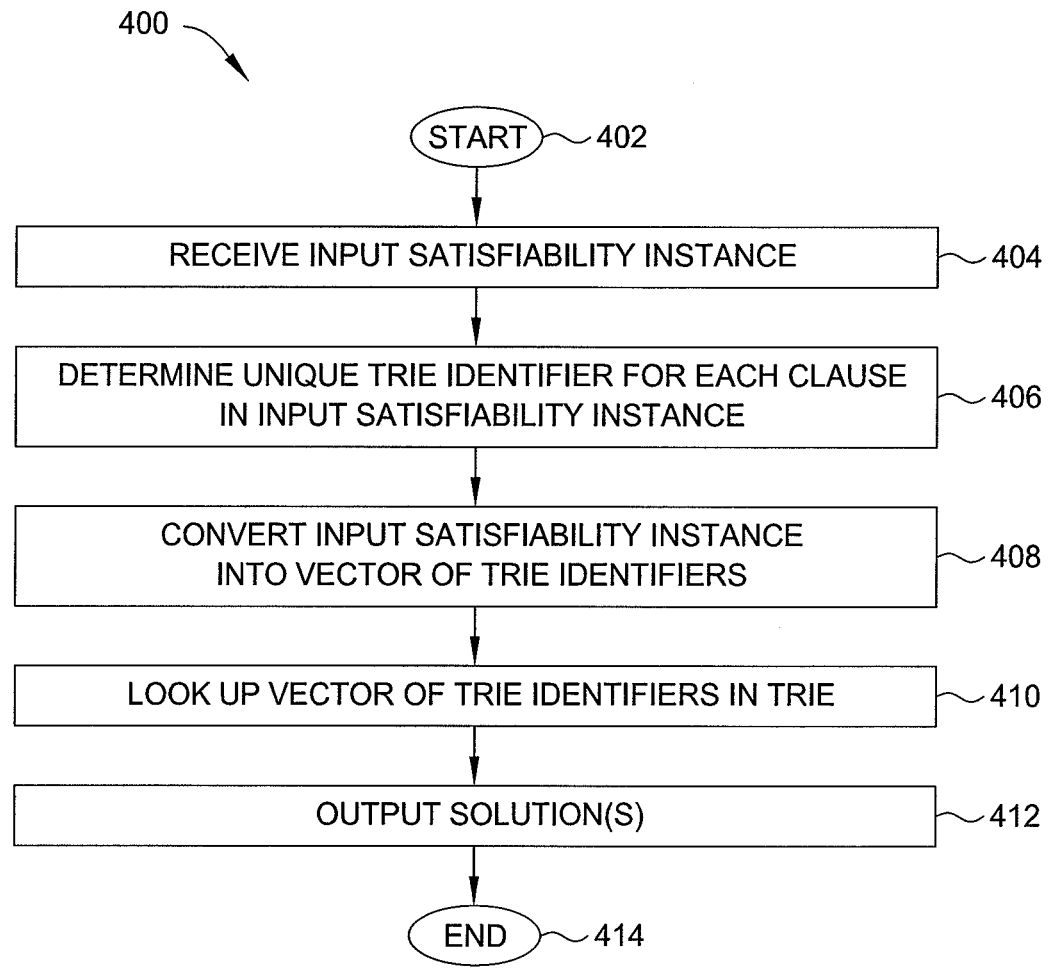
FIG. 4 is a flow diagram illustrating one embodiment of a method for searching a satisfiability database.

FIG. 4 is a flow diagram illustrating one embodiment of a method 400 for searching a satisfiability database. The method 400 may be implemented, for example, to search a database that indexes and stores satisfiability instances as a nested trie, like that discussed above. Thus, the method 400 may be implemented in conjunction with the search engine 108 illustrated in FIG. 1. As such, the discussion of the method 400 makes reference to the search engine 108. However, it will be appreciated that the method 400 is not limited to execution on the satisfiability solution engine 100, and may be implemented in conjunction with systems having alternative configurations.

The method 400 begins in step 402. In step 404, the search engine 108 receives an input satisfiability instance. As an example, the input satisfiability instance is assumed to contain several clauses.

In step 406, the search engine 108 determines a unique trie identifier for each clause in the input satisfiability instance. In one embodiment, this determination is made by looking up the identifiers in the trie. If an identifier cannot be found for a given clause, then the input satisfiability instance is not yet present in the satisfiability database.

In step 408, the search engine 108 converts the input satisfiability instance into a vector of trie identifiers.

In step 410, the search engine 108 looks up the vector of trie identifiers in the trie. If the lookup fails, then input satisfiability instance is not yet present in the satisfiability database.

In step 412, the search engine 108 outputs any solutions found through the look up (e.g., to the client from which the input satisfiability instance was received).

The method 400 ends in step 414.

As an alternative to trie storage (which may require distinct tries for clauses and instances), embodiments of the invention may store satisfiability instances as zero-suppressed binary decision diagram (ZDD) representations. ZDD representations fold both the clauses and the instances into a single compact data structure.

A ZDD is a special kind of multi-rooted, directed cyclic graph (DAG). A ZDD is special in the sense that any node will have either no successors (children) or precisely two successors, and there are precisely two leaf nodes. The first leaf node represents TRUE (an empty instance), while the second leaf node represents FALSE (an instance containing an empty clause). From the reference point of a non-leaf node, one of its children will be referred to as the "inclusive" child, and the other of its children will be referred to as the "exclusive" child.

Figure 5:
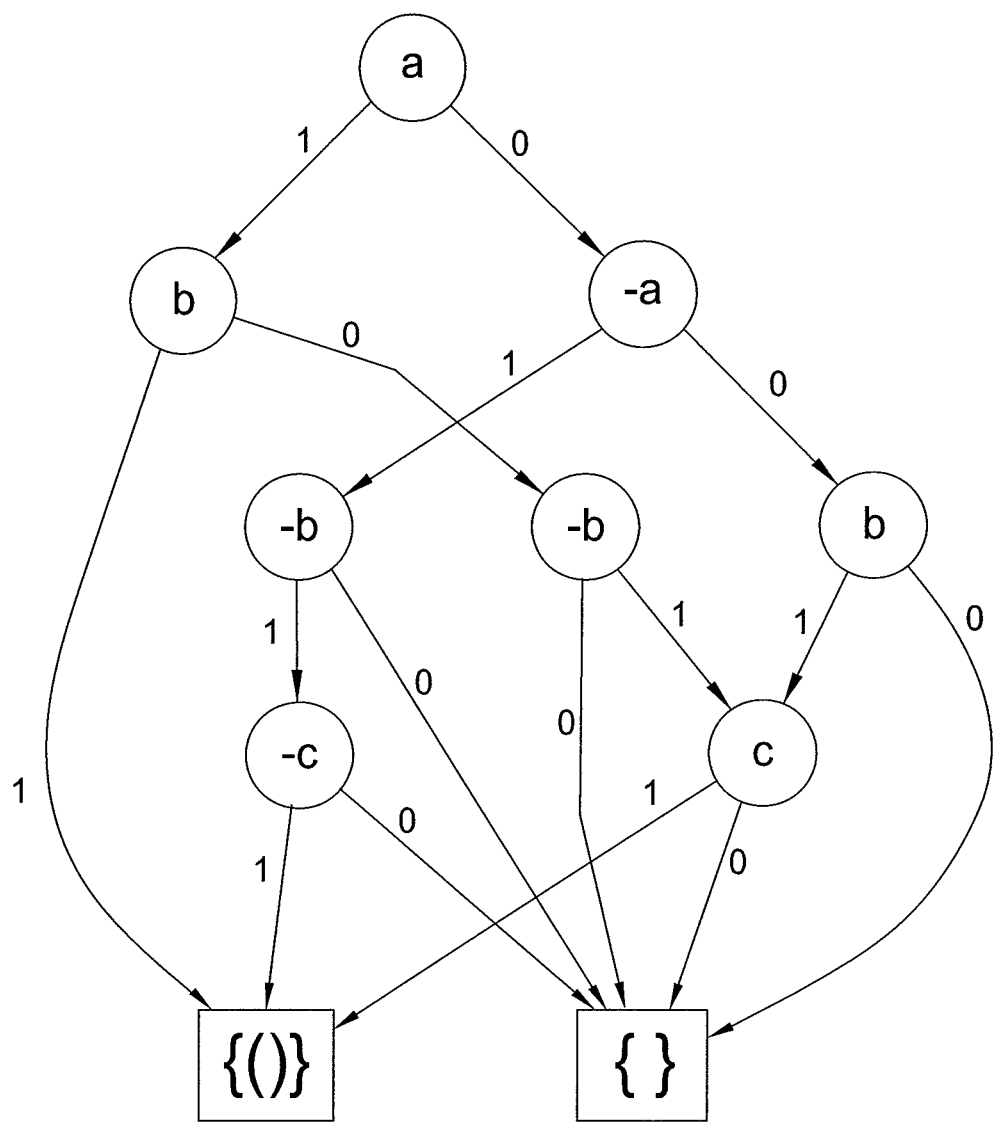
FIG. 5 is a zero-suppressed binary decision diagram representation for an exemplary satisfiability instance.

FIG. 5 is a zero-suppressed binary decision diagram representation for an exemplary satisfiability instance. In particular, the exemplary satisfiability instance is {(−a −b −c)(b c)(a −b c)(a b)}, assuming the order a <−a<b<−b<c<−c.

Each node in the ZDD illustrated in FIG. 5 identifies a unique satisfiability instance. A prerequisite is that a fixed order of the literals is decided (e.g., one could take the "natural" order of the numbers in which they are proposed to be encoded: literal zero comes before literal one, etc.).

Typically, the roots of the ZDD represent the satisfiability instances of interest. Taking any root of a given ZDD, its satisfiability instance can be reconstructed according to the following. First, if the node is the FALSE leaf node, then the instance contains the empty clause (i.e., {( )}) is constructed. Alternatively, if the node is the TRUE leaf node, then the empty instance (i.e., { }) is constructed. If the node is not a leaf node, then it is labeled by some literal 1. Assuming that the instances of the children nodes are respectively available as the inclusive instance I and the exclusive instance E, a new instance I' is constructed by including the literal 1 to each clause of the inclusive I. Thus, I={(−a b)(a −b c)} becomes I'={(−a b 1)(a −b c 1)}. The union of the new instance I' and the exclusive instance E is then taken. Thus, the union of I'={(−a b 1)(a −b c 1)} and E={(a b)} becomes {(−a b 1)(a −b c 1)(a b)}. This result indicates that a ZDD can represent an collection of satisfiability instances.

Figure 6:
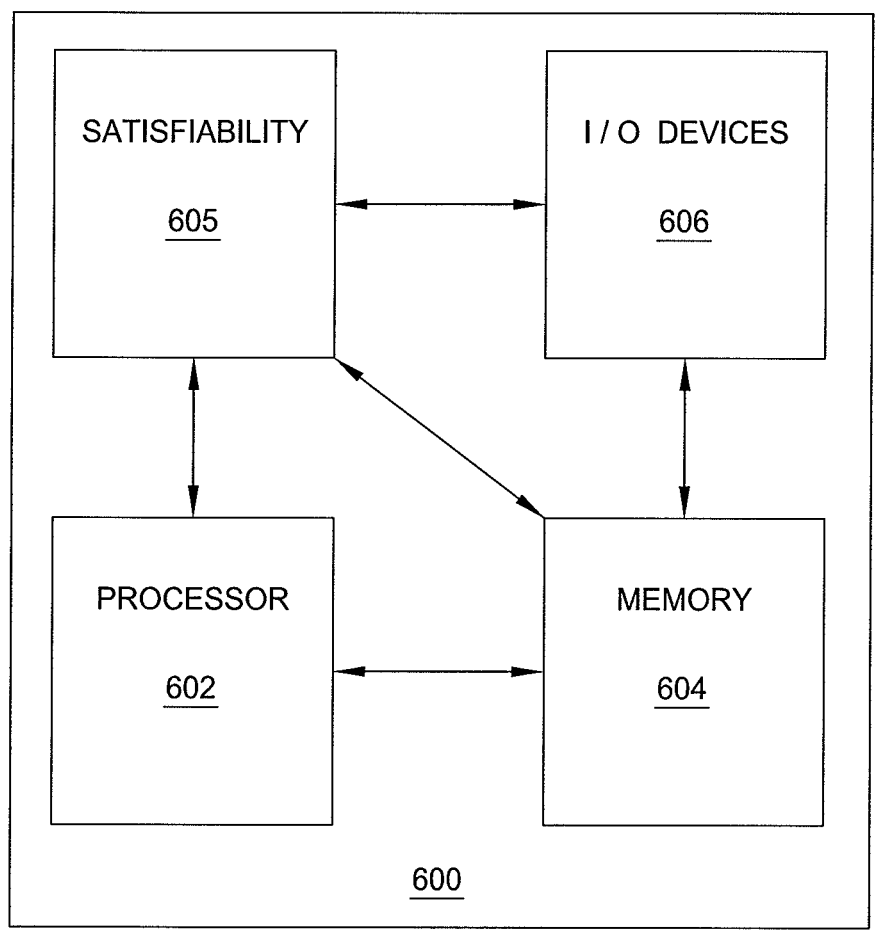
FIG. 6 is a high level block diagram of the present invention implemented using a general purpose computing device.

FIG. 6 is a high level block diagram of the present invention implemented using a general purpose computing device 600. In one embodiment, the general purpose computing device 600 is deployed as a satisfiability solution engine, such as the satisfiability solution engine 100 illustrated in FIG. 1. In an alternative embodiment, the satisfiability solution engine 100 represents one part of the general purpose computing device 600. It should be understood that embodiments of the invention can be implemented as a physical device or subsystem that is coupled to a processor through a communication channel. Therefore, in one embodiment, a general purpose computing device 600 comprises a processor 602, a memory 604, a satisfiability solution module 605, and various input/output (I/O) devices 306 such as a display, a keyboard, a mouse, a modem, a microphone, speakers, a touch screen, an adaptable I/O device, and the like. In one embodiment, at least one I/O device is a storage device (e.g., a disk drive, an optical disk drive, a floppy disk drive).

Alternatively, embodiments of the present invention (e.g., satisfiability solution module 605) can be represented by one or more software applications (or even a combination of software and hardware, e.g., using Application Specific Integrated Circuits (ASIC)), where the software is loaded from a storage medium (e.g., I/O devices 606) and operated by the processor 602 in the memory 604 of the general purpose computing device 600. Thus, in one embodiment, the satisfiability solution module 605 for solving satisfiability problems through search described herein with reference to the preceding Figures can be stored on a tangible or non-transitory computer readable medium (e.g., RAM, magnetic or optical drive or diskette, and the like).

It should be noted that although not explicitly specified, one or more steps of the methods described herein may include a storing, displaying and/or outputting step as required for a particular application. In other words, any data, records, fields, and/or intermediate results discussed in the methods can be stored, displayed, and/or outputted to another device as required for a particular application. Furthermore, steps or blocks in the accompanying Figures that recite a determining operation or involve a decision, do not necessarily require that both branches of the determining operation be practiced. In other words, one of the branches of the determining operation can be deemed as an optional step.

Although various embodiments which incorporate the teachings of the present invention have been shown and described in detail herein, those skilled in the art can readily devise many other varied embodiments that still incorporate these teachings.

What is claimed is:

1. A method, comprising:
receiving, by a solution engine including a search engine and a satisfiability solver, an automatically generated test pattern, wherein the automatically generated test pattern is formulated as an input satisfiability instance comprising a plurality of clauses, wherein variables of the input satisfiability instance represent various parameters of the automatically generated test pattern, and wherein the satisfiability solver comprises a processor programmed to perform algorithmic operations that make attempts to assign values to the variables that will cause the input satisfiability instance to evaluate to TRUE and designate the input satisfiability instance as unsatisfiable when the attempts are unsuccessful;
deciding, based on pre-processing of the input satisfiability instance by the solution engine, to submit the input satisfiability instance to the search engine instead of to the satisfiability solver for solution;
searching a database, using the search engine, for a stored satisfiability instance that matches the input satisfiability instance, wherein the stored satisfiability instance includes a stored solution comprising either variable assignments that cause the stored satisfiability instance to evaluate to TRUE or an indication that the stored satisfiability instance cannot be satisfied, wherein the database is organized as a trie having a root node and a plurality of leaf nodes, each leaf node of the plurality of leaf nodes being connected to the root node by a respective path that represents a clause, and wherein the searching comprises:
matching each clause of the plurality of clauses in the input satisfiability to a leaf node of the plurality of leaf nodes;
determining, for each leaf node to which a clause of the plurality of clauses was matched, an associated identifier, such that a plurality of identifiers is determined;
ordering the plurality of identifiers to form a vector that represents the input satisfiability instance; and
identifying a matching node in the trie that corresponds to the vector; and
outputting, by the solution engine, a solution associated with the matching node as the solution to the input satisfiability instance.

2. The method of claim 1, wherein the database is a centralized repository.

3. The method of claim 1, wherein the database is a distributed repository.

4. The method of claim 1, wherein entries in the database are organized according to applications to which the entries apply.

5. The method of claim 1, wherein the solution comprises a plurality of different solutions.

6. The method of claim 5, wherein each of the plurality of different solutions is associated with a different application-specific characteristic.

7. The method of claim 1, wherein the satisfiability solver is one of a plurality of different satisfiability solvers included in the solution engine.

8. The method of claim 1, wherein the stored solution is one of a plurality of stored solutions to the stored satisfiability instance, and the plurality of stored solutions are related to each other in the database.

9. The method of claim 1, wherein the database is supplemented through crowd sourcing.

10. A non-transitory computer readable storage medium containing an executable program for operating a solution engine including a search engine and a satisfiability solver, where the program causes the solution engine to perform steps comprising:
  receiving an automatically generated test pattern, wherein the automatically generated test pattern is formulated as an input satisfiability instance comprising a plurality of clauses, wherein variables of the input satisfiability instance represent various parameters of the automatically generated test pattern, and wherein the satisfiability solver comprises a processor programmed to perform algorithmic operations that make attempts to assign values to the variables that will cause the input satisfiability instance to evaluate to TRUE and designate the input satisfiability instance as unsatisfiable when the attempts are unsuccessful;
  deciding, based on pre-processing of the input satisfiability instance by the solution engine, to submit the input satisfiability instance to the search engine instead of to the satisfiability solver for solution;
  searching a database, using the search engine, for a stored satisfiability instance that matches the input satisfiability instance, wherein the stored satisfiability instance includes a stored solution comprising either variable assignments that cause the stored satisfiability instance to evaluate to TRUE or an indication that the stored satisfiability instance cannot be satisfied, wherein the database is organized as a trie having a root node and a plurality of leaf nodes, each leaf node of the plurality of leaf nodes being connected to the root node by a respective path that represents a clause, and wherein the searching comprises:
    matching each clause of the plurality of clauses in the input satisfiability to a leaf node of the plurality of leaf nodes;
    determining, for each leaf node to which a clause of the plurality of clauses was matched, an associated identifier, such that a plurality of identifiers is determined;
    ordering the plurality of identifiers to form a vector that represents the input satisfiability instance; and
    identifying a matching node in the trie that corresponds to the vector; and
  outputting, by the solution engine, a solution associated with the matching node as the solution to the input satisfiability instance.

11. A solution engine, comprising:
  a search engine;
  a satisfiability solver; and
  executable instructions for operating the solution engine, where the executable instructions cause the solution engine to perform steps comprising:
    receiving an automatically generated test pattern, wherein the automatically generated test pattern is formulated as an input satisfiability instance comprising a plurality of clauses, wherein variables of the input satisfiability instance represent various parameters of the automatically generated test pattern, and wherein the satisfiability solver comprises a processor programmed to perform algorithmic operations that make attempts to assign values to the variables that will cause the input satisfiability instance to evaluate to TRUE and designate the input satisfiability instance as unsatisfiable when the attempts are unsuccessful;
    deciding, based on pre-processing of the input satisfiability instance by the solution engine, to submit the input satisfiability instance to the search engine instead of to the satisfiability solver for solution;
    searching a database, using the search engine, for a stored satisfiability instance that matches the input satisfiability instance, wherein the stored satisfiability instance includes a stored solution comprising either variable assignments that cause the stored satisfiability instance to evaluate to TRUE or an indication that the stored satisfiability instance cannot be satisfied, wherein the database is organized as a trie having a root node and a plurality of leaf nodes, each leaf node of the plurality of leaf nodes being connected to the root node by a respective path that represents a clause, and wherein the searching comprises:
      matching each clause of the plurality of clauses in the input satisfiability to a leaf node of the plurality of leaf nodes;
      determining, for each leaf node to which a clause of the plurality of clauses was matched, an associated identifier, such that a plurality of identifiers is determined;
      ordering the plurality of identifiers to form a vector that represents the input satisfiability instance; and
      identifying a matching node in the trie that corresponds to the vector; and
    outputting, by the solution engine, a solution associated with the matching node as the solution to the input satisfiability instance.

* * * * *